United States Patent [19]

Dalton, Jr.

[11] 4,126,823
[45] Nov. 21, 1978

[54] MAGNETIC FIELD DETECTION APPARATUS

[76] Inventor: Murphy L. Dalton, Jr., 6035 Aberdeen, Dallas, Tex. 75230

[21] Appl. No.: 856,013

[22] Filed: Dec. 22, 1977

[51] Int. Cl.² .......................................... G01R 33/08
[52] U.S. Cl. ............................ 324/0.5 E; 324/0.5 R
[58] Field of Search ................. 324/0.5 R, 0.5 E, 207, 324/208, 244, 256, 259

[56] References Cited

U.S. PATENT DOCUMENTS

| 3,081,428 | 3/1963 | Fowler | 324/0.5 E |
| 3,257,608 | 6/1966 | Bell et al. | 324/0.5 E |
| 3,441,838 | 4/1969 | Salvi | 324/0.5 E |
| 3,495,160 | 2/1970 | Raffini et al. | 324/0.5 E |

*Primary Examiner*—M. Tokar

[57] ABSTRACT

A magnetic field detector for determining the presence of a magnetic field disturbance in the vicinity of the apparatus senses the difference in magnetic fields at two spaced-apart locations. A pair of field sensors, each including a body of polarizable liquid and a probing coil, are connected in series and provide an output signal that is produced in the coils by the free precession of the protons of the liquid bodies in the earth's magnetic field. A timer circuit controls a relay to alternately connect the magnetometer coils to a source of polarizing current during a polarizing period, and to detection circuitry during a listening period. The detection circuitry includes a high gain signal channel comprising a multi-stage, high input impedance preamplifier and a bandpass amplifier tuned to the frequency range of the signals generated in the probing coils. The output signal from the high gain signal channel is applied to a rectifying circuit that rectifies the amplified free precession signals at a selected bias level to produce a signal that reduces to zero as the free precession signals in the coils decay. Filtering and amplifying of the rectified signal is provided, with the signal being finally applied to a meter operable to follow a low frequency beat signal and provide for the observation and timing of the length of the interval between the beginning of the listening period and the occurrence of the first subsequent minimum value of the beat signal. The time interval is marked by deflections of the meter movement and characterizes the size and distance of a detected object.

15 Claims, 10 Drawing Figures

MAGNETIC FIELD DETECTION APPARATUS

BACKGROUND OF THE INVENTION

The instant invention relates to apparatus for detecting the presence of a magnetic field disturbance. More particularly, the instant invention relates to a magnetic field detector having a pair of spaced-apart field sensors for sensing a variation in the earth's magnetic field caused by the presence of a magnetic anomaly in the vicinity of the magnetic field detector apparatus.

An effective device for measuring magnetic fields and locating magnetic anomalies is the magnetometer. The capability of magnetometers to detect the presence of magnetic anomalies is well known and has found significant use. One magnetometer that has been found to be suitable for detecting the presence of ferromagnetic bodies is the proton magnetometer. This magnetometer is based in principle upon the phenomenon of free nuclear precession.

One instrument in the prior art that utilizes proton magnetometers to detect the presence of ferromagnetic bodies is that described and shown schematically in a book, *Physics and Archaeology*, authored by M. J. Aitken and published in London in 1961 by Interscience Publishers, Inc. The instrument shown therein utilizes two field sensors separated by a distance and used to measure the average gradient over the distance. The sensors themselves each comprise a bottle of liquid having a coil of wire placed around the outside of the bottle. the two coils are connected in series and are supplied with a polarizing current. Since proton magnetometers operate on the free proton precession phenomenon, if the two bottles are in the same magnetic field strength, the sum of the two signals is merely twice the amplitude of one of the signals and decays to zero. If the bottles experience different fields, however, the frequencies of the signals are different; and the two signals will successively get in and out of phase thereby producing a beat frequency. Because the two sensor signals are being summed, the beat frequency, which is the frequency different between the two component signals, will result.

An output signal comprising the sum of the two individual sensor signals is applied to a high input impedance preamplifier. The output signal from the preamplifier is then applied to the input of an amplifier circuit tuned to pass only signals of a frequency within a particular band. A final amplifier stage is provided which feeds a loudspeaker to produce an audible sound indicative of the presence or absence of a search object detectable by the instrument.

In one of the more particular details of the instrument, the bottle coils, which are connected in series, are pulsed by a common polarizing current through a single relay contact. A timing flip-flop automatically controls the relay in order to alternately connect the bottle coils to a source of polarizing current and to the input of a preamplifier. This arrangement provides "listening" periods between the polarizing periods.

The period of the beat signal indicates the strength of the disturbance, with the length of time required for the best signal to drop to its first zero being the least when the detected object is reached. The loudspeaker is provided to make available a readout indication of the best frequency. In the absence of a magnetic disturbance, a gradually decaying signal of a fixed frequency is heard during each listening period. In the presence of a magnetic disturbance, "bleeps" or beat signals are heard, and the greater the strength of the disturbance—the more beats or bleeps within the listening period that will be heard. As an alternative to an audio readout, it is suggested in the book that the rate of decay of the beat frequency can be timed electronically. Also, the number of oscillations occurring during the listening period or during some portion thereof could be counted to provide a readout of field strength.

Although the instrument described is an effective magnetic anomaly sensor, the design integrates the human ear into the detector loop. To obtain a high degree of accuracy in measuring the strength of a detected magnetic anomaly, it is desirable to measure the period of time between the beginning of a listening period and the first detectable beat signal minimum. The ear's ability to detect a minimum requires a high signal-to-noise ratio, making an accurate determination of small field strengths difficult to obtain with the instrument.

A magnetic field measurement apparatus that utilizes nuclear magnetic resonance in the measurement of a varying magnetic field is that disclosed in U.S. Pat. No. 3,260,926. The apparatus disclosed comprises a magnetometer having an integrating circuit coupled to the output leads of a pair of polarizing coils. A controlled switch is provided which operates in a first position to hold the integrating circuit output at zero and in a second position to apply the voltage induced in the coil windings to the input of the integrating circuit, while simultaneously releasing the output of the integrating circuit.

The signal available from the integrating amplifier circuit is fed to the input terminals of a graphical type recorder. The recorder is disclosed as possibly being an oscilloscope or other form of x-y display. In any event, the resulting visual display produced will show the resonance lines plotted against magnetic field value. Alternatively, the integrating amplifier circuit output voltage could be supplied to an accurate volt meter or digital volt meter. The amplifier output voltage for a given magnetic field intensity will be related by a mathematical relation that involves not only the voltage but the component values of the integrating circuit amplifier and the physical dimensions of the magnetometer probe coil.

Another magnetic field measurement apparatus that utilizes nuclear magnetic resonance type magnetometers is that disclosed in U.S. Pat. No. 3,441,838. The apparatus described therein has a pair of vessels that each contain a material having gyromagnetic properties. Two pairs of coils are used with one coil of each pair being wound about a different one of the vessels. One pair of coils is connected in series and coupled to the input of a linear amplifier. The other pair of coils, also serially connected, are further connected to the output of the amplifier. The output of the amplifier is fed to a frequency meter.

SUMMARY OF THE INVENTION

In accordance with the present invention, a magnetic field detector of the type having a pair of magnetically polarizable liquid bodies carried in spaced-apart relation, each having a separate one of a pair of serially connected magnetic probing coils wound therearound, and including a timer alternately applying current to the coils to polarize the liquid bodies and removing the polarizing current during a preset listening interval intervening the polarizing intervals, is provided. In addition to the foregoing structure, a magnetic field detector in accordance with the present invention includes a combination which comprises a high gain signal channel tuned to the frequency of the free precession signals generated in the magnetic probing coils, which signal channel serves to amplify the signals. A means of rectifying the signal carried on the high gain signal channel at a selected bias level to provide a signal at its output which reduces to zero as the free precession signals in the coils decay. A meter having a meter movement operative to follow low frequency beat signals present in the output signal of the rectifier is provided. The meter provides for the observation and timing of the length of the interval between each removal of polarizing current and the occurrence of the first subsequent minimum value of the beat signal.

In accordance with the more particular aspects of the present invention, the high gain signal channel comprises a multi-stage preamplifier section having a high input impedance. The high gain signal channel further includes a bandpass amplifier section coupled to the output of the preamplifier. The bandpass amplifier has a parallel resonance network in a feedback path between the input and output of the amplifier. More particularly, the parallel resonance network comprises an inductor and a capacitor.

In another more particular aspect of the present invention, the means of rectifying the beat signal from the high gain signal channel includes a rectifier circuit having rectification level control means. The rectifying means further includes a filter network that receives the rectified signal and is connected at its output to a driver amplifier. The rectifier circuit in a particular configuration is a single stage ac amplifier having a biasing network at its input which comprises a variable impedance component that shifts the operating point of the amplifier. The rectifier means acts as a peak detector to extract a low frequency beat signal imposed as an envelope on the amplified sum of the signals induced in the coils.

In other more general aspects, a magnetic field detector in accordance with the present invention comprises a cylinder formed of nonmagnetic material, which cylinder has at least one window intermediate the ends. A receptacle of polarizable liquid is carried in each end of the cylinder, with each receptacle being surrounded by a coil for polarizing the protons of the liquid contained therein. A housing is carried inside the cylinder proximate the window for enclosing a circuit board having electronic circuitry thereon which is operably connected to the polarizing coils. The cylinder also carries electromagnetic shielding that encloses the interconnections between the electronic circuitry and the coils. A meter operably connected to the electronic circuitry is carried on the cylinder for visual inspection thereof.

In a particular, the cylinder can be constructed of PVC plastic tubing. The housing for the electronic circuitry can also be constructed of PVC plastic tubing of a smaller size than that used for cylinder.

These and other aspects of the present invention will be more apparent from the description of a particular preferred embodiment which follows below.

DESCRIPTION OF THE DRAWINGS

A more complete appreciation of the invention may be had by reference to the accompanying drawings, illustrating preferred embodiments of the invention to be described in detail, wherein.

DESCRIPTION OF A PREFERRED EMBODIMENT

A. General

The magnetic field detector of the present invention in general involves the determination of a small difference in magnetic fields at two locations accomplished by the utilization of two sensors placed in spaced-apart relation. In the particular embodiment to be described herein, the sensors are filled with magnetic field sensitive protons embodying the theory of free nuclear precession.

Proton magnetometers typically monitor the precession of protons present in a polarized liquid about the earth's magnetic field. In a conventional proton magnetometer, a coil is wrapped around a bottle containing a proton carrying liquid. Introduction of current into the coil causes the protons to be aligned and point in the same direction, a direction which is at an angle with the direction of the earth's magnetic field. Upon the cessation of current flow in the coil, the protons undergo precession about the earth's field which induces a voltage in the coil. The voltage $v$ induced in a coil by the precession is given by $$v = 2\pi f \mu \sin\theta \cos 2\pi f t \quad (1)$$

where $f$ is the frequency of precession in hertz, $\mu$ is the magnetic moment of the proton, $\theta$ is the angle between earth's field and the magnetic moment of the spinning electron and $t$ is time. the relationship between the frequency of precession and the intensity of the earth's magnetic field is linear and is given by the equation $$f = \mu F / 2\pi p \quad (2)$$

where $p$ is the angular momentum of the proton, $\mu$ is the magnetic moment of the proton, $F$ is the intensity of earth's magnetic field, and $f$ is the frequency of precession.

The proton magnetometer is a device that is extremely sensitive to small changes in the earth's magnetic field. As an example, proton magnetometers are suitable for ferromagnetic magnetic field detecting applications. Although a single proton magnetometer can be utilized to monitor the total field intensity, most applications for a magnetic field change detection have as their objective the determination of spatial changes in the earth's field, and thus do not require total field measurements. Moreover, total field can change with time for a great many reasons. Therefore, a magnetic field detector which is insensitive to total field is frequently more desirable. Accordingly, in most magnetic field detector applications, magnetic gradient is more significant than is the total field intensity.

The magnetic field detector of the present invention, having as its object the determination of a magnetic gradient, employs two spaced-apart sensors. Accordingly, the magnetic field detector has the sensing protons arranged to provide a gradient magnetometer and utilizes two bodies of polarizable liquid, each of which has a coil wrapped around it. The coils are connected in series to provide an output signal that is the sum of the two individual coil signals. This voltage sum S appears at the output of the series connection as $$S = \cos 2\pi f_1 t + \cos 2\pi f_2 t \qquad (3)$$

By applying the appropriate trigonometric identity to equation (3), the voltage sum S can be rewritten as $$S = 2\cos\pi (f_1 t - f_2 t) \cos\pi (f_1 t + f_2 t) \qquad (4)$$

The above expression, as will be readily appreciated, has a required maximum at $t = 0$. The voltage sum signal has an envelope, or modulation term $\cos (f_1 t - f_2 t)$, that reaches a first minimum when $f_1 t - f_2 t = \frac{1}{2}$. Since the time to this first minimum from the point in time marked by the cessation of current flow in the coils can be designated $t_2$, the expression above can be rewritten as $f_1 - f_2 = \frac{1}{2} t_2$. The longer $t_2$ is, the smaller the detectable carrier frequency difference which can be measured and, the smaller the detected field strength difference. It will be appreciated that in a magnetic field detector using a pair of spaced-apart sensors following the theory of operation outlined above, that the closer the magnetic field detector comes to the object producing the magnetic anomaly, the greater the difference in the detected magnetic field experienced by each sensor. This results in a greater frequency in individual sensor induced voltage signals and leads to a shorter time between the cessation of current flow in the coils and the first detectable beat frequency minimum value.

B. Mechanical Construction

Figure 1:
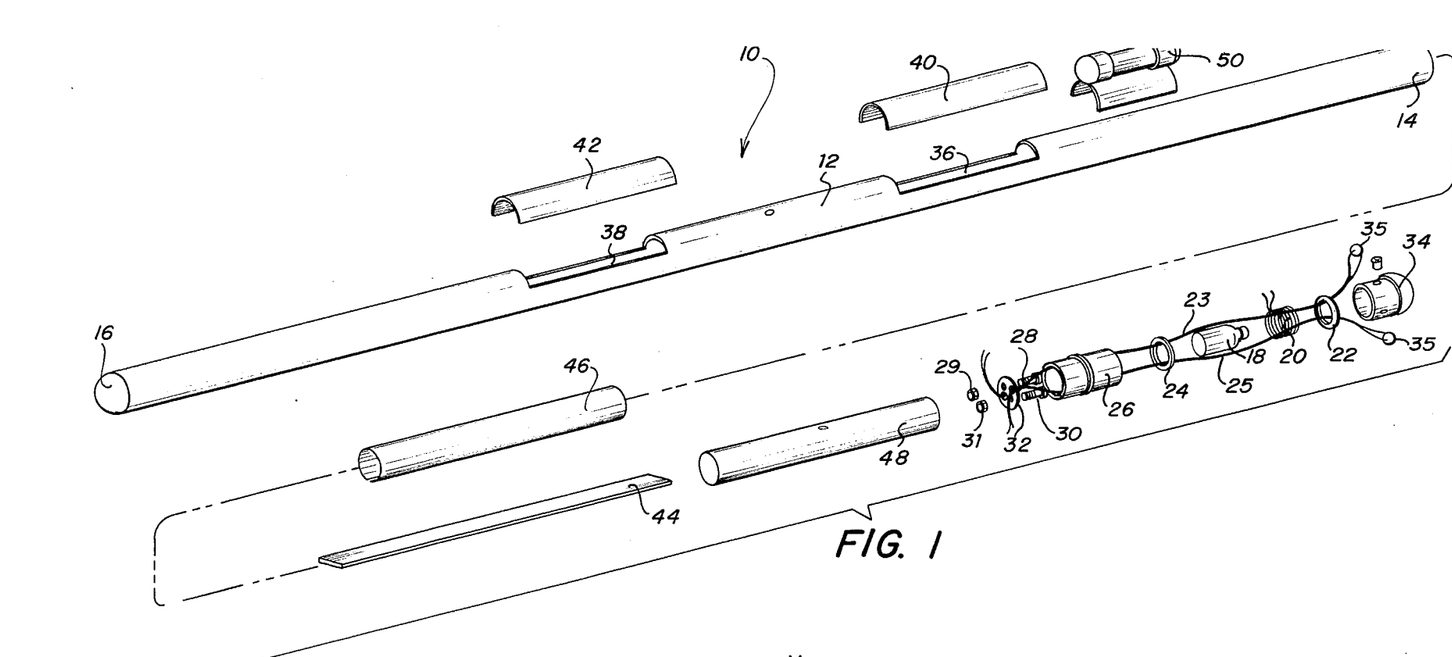
FIG. 1 is an exploded view of a particular magnetic field detector apparatus illustrating mechanical construction details thereof.

Referring now to FIG. 1 of the Drawings, there is shown in an exploded view a magnetic field detector 10 constructed in accordance with the present invention. More particularly, an elongated cylinder 12 formed of nonmagnetic material is provided. At each of the ends 14 and 16 of cylinder 12, there is carried a magnetically polarizable liquid body. Illustrative of the arrangement for carrying the liquid bodies at the ends of cylinder 12 is the detailed presentation of the mechanical arrangement for so carrying the liquid body in the end 14. The mechanical arrangement is duplicated in end 16 for the other probing coil.

The polarizable liquid body is carried in a receptacle 18 which can be a plastic bottle. Receptacle 18 is surrounded by a coil 20 for polarizing the protons in the liquid contained within receptacle 18. Coil bobbins 22 and 24 are placed on receptacle 18, and it is between coil bobbins 20 and 24 that coil 20 is wound. Looped nylon lines 23 are each strung through a bead 35 which holds the bobbin on receptacle 18 when the two looped nylon lines are tied together at the terminal support disc 32. The assembly comprising the coil, bobbin, nylon lines and bottle is tied to the terminal support disc by stringing the nylon lines through two holes in the disc and tying these lines securely so that the disc is held firmly against the bottom of the bottle. Two bolts 28, 30 pass through the terminal support disc and are tightened by nuts 29, 31 to disc 32. These nut-bolt pairs act as terminals for the coil by securing the coil wires thereto. The bottle 18 and coil 20 are inserted within detection receptacle housing 26, which is itself inserted in the open end 14 of cylinder 12, with a cover 34 being placed over the open end.

Cylinder 12 has a first window 36 and a second window 38 intermediate the ends thereof. Window 36 is provided with an access port cover 40, and window 38 is provided with an access port cover 42. Both covers are removable. The removable access port covers provide access through the windows to the electronics which are carried on a circuit board 44 mounted inside cylinder 12. The electronic circuit board 44 is mounted in a separate one-piece housing 46 having a cut along its length allowing it to clamp onto circuit board 44. The mounting of the electronics in a separate housing secured within cylinder 12 provides a desired resistance to shock potentially encountered by impact of forces created through dropping of the apparatus or striking of the apparatus against an object. Electromagnetic shielding 48 is provided to enclose the interconnections between the electronic circuitry and the probing coils and protect against the picking up of spurious external signals. Finally, a meter 50 is provided which can be mounted on cylinder 12 or carried separately.

Cylinder 12 can be constructed of PVC plastic tubing. This material is not only nonmagnetic, but it also provides a high impact resistant, lightweight material. In addition, the plastic provides a reflective shield from solar visible and near infrared radiation. The bottle housings carried in the ends of cylinder 12 can also by PVC plastic tubing of a smaller size than that used for cylinder 12. In a preferred embodiment, the polarizable liquid bodies are distilled water.

C. Electronic Circuitry

As mentioned briefly in the general discussion, the two magnetometer probing coils are connected in series and are energized by a common polarizing current to insure that the two field sensor signals have the same phase and also to accomplish the addition of the two signals without the need of a mixing circuit. As the output terminals of the coils must alternately be connected to a source of current and disconnected therefrom and reconnected to the input of the electronics, means must be provided to automatically perform this timing function and provide "listening" periods of a proper duration. Typically, approximately four seconds is provided for both the listen and polarize phases. A longer listening period will result in greater sensitivity, while a longer polarizing time gives a stronger signal.

Figure 2:
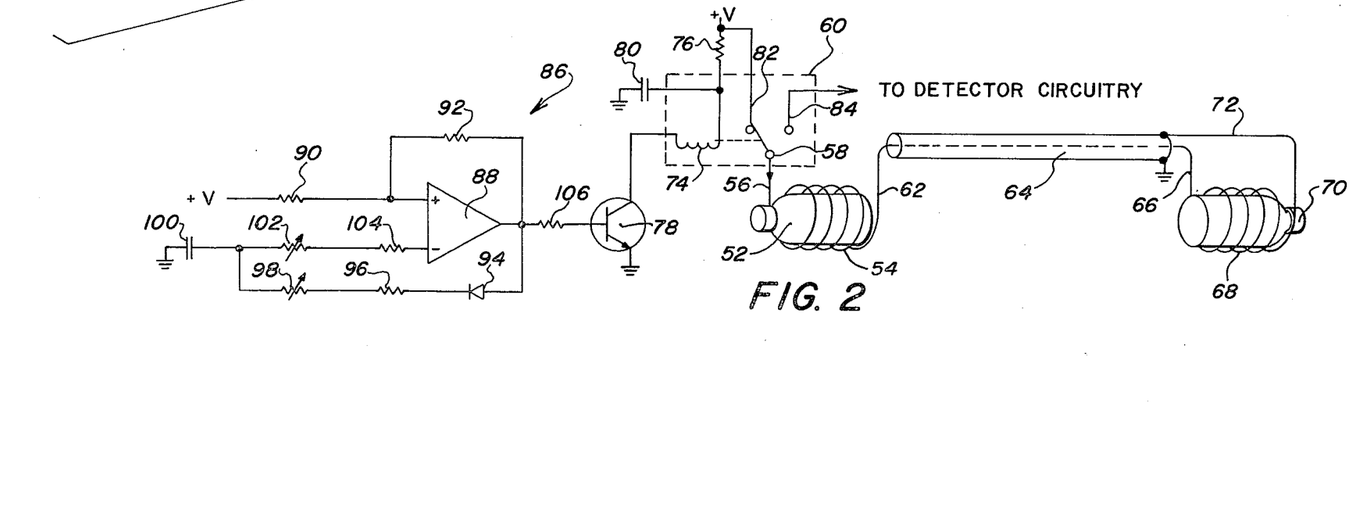
FIG. 2 is a schematic diagram of the electronic circuitry used to implement a timer for controlling a relay to alternately polarize the liquid bodies and provide a listening period.

Referring to FIG. 2, electronic circuitry for providing timer means to alternately apply current to the coils to polarize the liquid bodies and removing the polarizing current during a preset listening interval intervening polarizing intervals is provided. In FIG. 2, a first container of liquid 52 having a coil 54 would therearound has one lead 56 connected to the center terminal 58 of a single pole double throw (SPDT) relay 60. The other end 62 of coil 54 passes through shielding 64 and connects to a first lead 66 of a second coil 68 which is wrapped around a container of polarizable liquid 70. The second lead 72 of coil 68 is connected to shielding 64 which is, of course, grounded.

The center contact of single pole double throw relay 60 is actuated by a coil 74. Energization of coil 74 is by current flow from the power supply through resistor 76 connected in series with coil 74. The series combination of resistor 76 and coil 74 are connected to the collector of driver transistor 78 which is operable in response to a signal on its base lead to establish the current flow through coil 74. A capacitor 80 is shunted across coil 74 and driver transistor 78.

The timing cycle in which driver transistor 78 energizes coil 74 to alternately switch relay 60 between one position, in which the lead 56 is connected to the positive power supply potential, and a second position, in which lead 56 is connected to detector circuitry through lead 84, is established by a squarewave generator generally referenced by the numeral 86. In general, the squarewave generator 86 comprises an operational amplifier (op-amp) 88 connected as a comparator. In the circuit configuration shown, a resistor 90 is connected between a source of positive potential and the noninverting input of op-amp 88. A resistor 92 is connected between the output of op-amp 88 and the noninverting input. A threshold level is set at the noninverting input of op-amp 88, with a portion of the output of op-amp 88 being fed back to a noninverting input terminal. In a second feedback path from the output of op-amp 88, there is a series connection of diode 94, resistor 96 and variable resistor 98. A capacitor 100 having one lead thereof connected to ground has the second lead connected to variable resistor 98 and also connected through variable resistor 102 and fixed resistor 104 to the inverting input of op-amp 88.

Under the influence of the reference voltage on the noninverting input of op-amp 88, the output of op-amp 88 will be at a positive voltage. However, as capacitor 100 begins charging, the voltage on the inverting input will increase. The output of op-amp 88 remains until the voltage on capacitor 100 reaches the preset threshold, whereupon the op-amp output reverses to the opposite voltage polarity. In the configuration shown, variable resistor 98 provides a pulse width control which sets the duration of the listen period and of the polarizing period within the total period of a cycle of operation. In addition, variable resistor 102 provides a pulse period control which sets the length of the operational cycle.

The output of op-amp 88 is coupled to the base lead of driver transistor 78 through a resistor 106. As the output polarity switches back and forth, transistor 78 is alternately driven into conduction and cut-off. This action of transistor 78 causes coil 74 to be alternately energized and de-energized, which results in a flip-flopping of relay 60.

Figure 3:
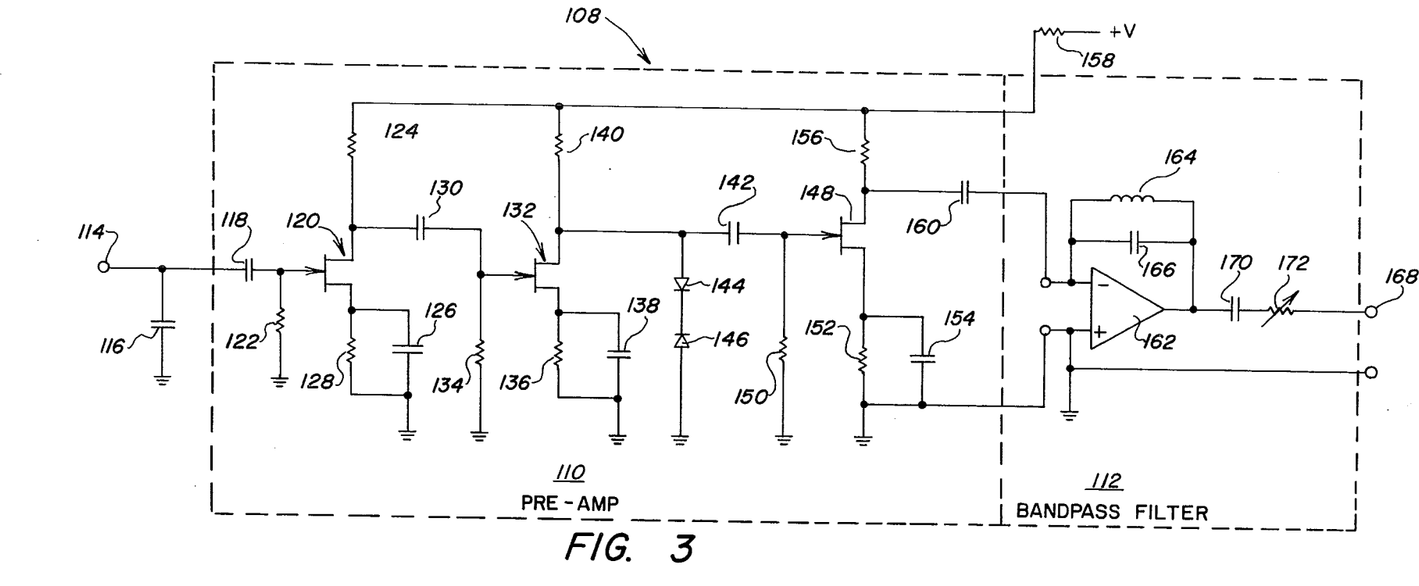
FIG. 3 is a schematic diagram of the electronic circuitry of the high gain signal channel that amplifies the signal from the coils during listening periods.

Referring next to FIG. 3, a high gain signal channel 108 tuned to the frequency of the free precession signals generated in coils 54 and 68 for amplifying the same is presented. More particularly, high gain signal channel 108 comprises a preamplifier section 110 and a bandpass filter section 112. The signal available during the listening phase of the cycle of operation from lead 84 of relay 60 is applied to input terminal 114 of signal channel 108. An input capacitor 116 in combination with coils 54 and 68 forms a tuned circuit and provides broad band input filtering.

Preamplifier section 110 is a three stage amplifier comprising three cascaded Field Effect Transistor (FET) circuits. The signal applied to terminal 114 is coupled to the first stage through a capacitor 118. The signal is applied to the gate lead of FET 120, which is biased by resistor 122. A resistor 124 is connected to the drain of FET 120, and an RC circuit comprising capacitor 126 and resistor 128 is connected between the source lead of FET 120 and ground potential. The output of the first stage is taken from the drain lead of FET 120 and coupled through a capacitor 130 to the gate of FET 132, which is biased by a resistor 134. Resistor 136 and capacitor 138 form an RC circuit in the source lead of transistor 132. A resistor 140 is connected from the drain to a source of positive potential. The output of the second stage is taken from the drain of FET 132 and is coupled to the next stage through a coupling capacitor 142. In addition, a pair of diodes 144 and 146 are connected anode to anode between the drain lead of FET 132 and ground potential to limit the output signal level of the second stage of amplification.

The signal coupled through capacitor 142 is applied to the gate lead of FET 148 which has a resistor 150 connected from the gate lead to ground potential. An RC circuit comprising resistor 152 and capacitor 154 is connected between the source lead and ground potential. A resistor 156 connects between the drain of FET 148 and the source of voltage that supplies the first and second amplification stages through a resistor 158. The output of preamplifier 110 is coupled to the input of bandpass filter section 112 through a capacitor 160.

Bandpass filter 112 comprises an operational amplifier 162 having a parallel resonance network in the feedback path between the output and input thereof. The parallel resonance network comprising inductor 164 and capacitor 166 produces a narrow bandpass active filter which is tuned to the frequency at which the protons are precessing within the liquid bodies in containers 52 and 70. The output signal from op-amp 162 is provided to the signal channel output terminal 168 through a capacitor 170 and a variable resistor 172.

Figure 4:
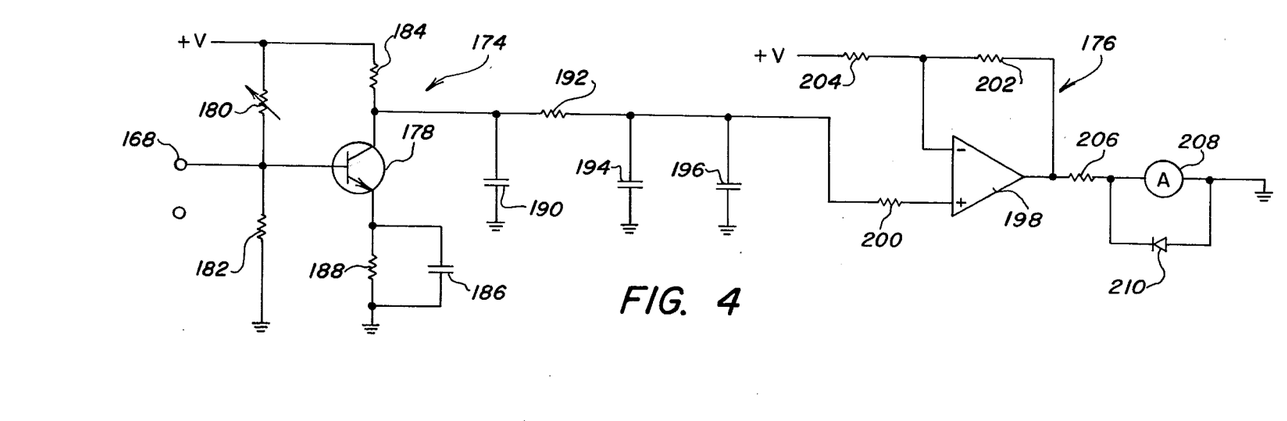
FIG. 4 is a schematic diagram of the electronic circuitry for rectifying the output signal from the high gain signal channel of FIG. 3 and supplying a rectified version of the signal to the meter readout.

Referring to FIG. 4, means to rectify the signal available at output terminal 168 of high gain signal channel 108 at a selected bias level to produce a signal which reduces to zero as the free precession signals decay is shown. The means includes a rectifier circuit generally designated by the numeral 174 and an amplifier circuit generally designated by the numeral 176. More specifically, the rectifier circuit 174 is a maximum and minimum peak detector having rectification level control means for shifting the threshold level at the input of circuit 174. Rectifier 174 comprises a transistor 178 which has a biasing network at its input that comprises a variable impedance component, resistor 180, operable to shift the detection level circuit 174. The biasing network further includes a fixed resistor 182. Both resistor 180 and resistor 182 are connected to the base lead of transistor 178. A resistor 184 connected to the collector lead of transistor 178 is tied to a source of positive potential, as is variable resistor 180. A parallel combination of capacitor 186 and resistor 188 are connected between the emitter of transistor 178 and ground potential.

The output of rectifier circuit 174 is taken from the collector of transistor 178 and applied to a filtering network comprising shunt capacitor 190, resistor 192 and parallel shunt capacitors 194, 196. Together, the rectifier circuit and filter network act as an envelope demodulator.

After filtering, the rectifier signal is supplied to amplifier circuit 176 which comprises an operational amplifier (op-amp) 198 having the signal from circuit 174 applied to its noninverting input through a resistor 200. A feedback resistor 202 connects to the inverting input of op-amp 198. In addition, a resistor 204 is connected between the inverting input and a source of positive potential. The output of amplifier circuit 176 is applied through a resistor 206 to a meter 208 having a diode 210 shunted across it.

In order to better understand the manner in which circuits 174 and 176 operate to provide a rectification of the output signal from signal channel 108, reference will now be made to FIGS. 5 and 6. Specifically, in FIG. 5, there is shown a representation of the unrectified signal available from high gain signal channel 108. The signal is the sum of the two individual voltage signals induced in the coils 54 and 68 and has the waveform shown when one of the liquid bodies is experiencing an external magnetic field of an intensity greater than the intensity of the magnetic field that the other coil is experiencing. In accordance with equation (4) above, the output signal shown is characterized by a beat modulation frequency that creates an envelope for the carrier waveform. As shown, the beat modulation frequency damps the carrier waveform. Damping depends upon the difference in the magnitudes of the magnetic field intensities experienced by the two coils.

Figure 5:
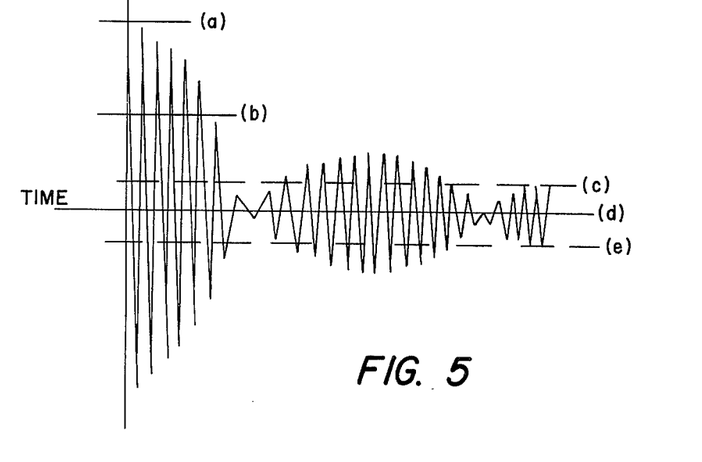
FIG. 5 is a representation of the signal waveform to be found at the output of the high gain signal channel during the listening period when the magnetic field detector is in the presence of a magnetic anomaly.
Figure 6A:
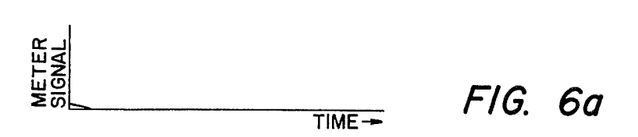
FIGS. 6a-6e are representations of the meter signal at various rectification levels of the waveform shown in FIG. 5.
Figure 6B:
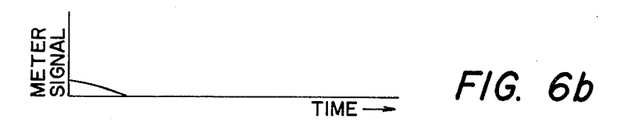
Figure 6C:
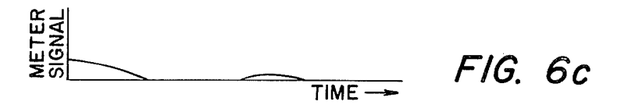
Figure 6D:
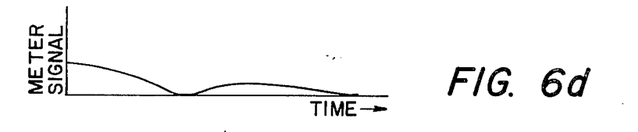
Figure 6E:
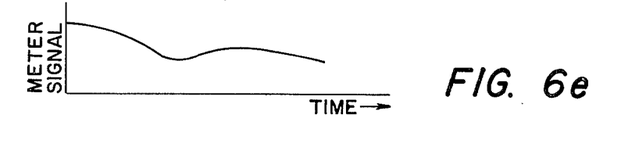

In order to provide a signal suitable for display on a meter movement, the signal of FIG. 5 must be rectified. If the detection level is set by variable resistor 180 to at a level corresponding to level ($a$) shown in FIG. 5, then only signals having an amplitude greater than level ($a$) will result in an output signal from circuit 176 to meter 208. For example, referring to FIG. 6$a$, the meter signal shown therein will be provided to meter 208. If, however, the bias on the input of circuit 174 is lowered to a level corresponding to level ($b$) shown in FIG. 5, then the signal applied to meter 208 will appear as that shown in FIG. 6$b$. Accordingly, as the detection level is shifted lower to levels corresponding to ($c$) and ($d$), then meter signals are shown in FIGS. 6$c$ and 6$d$ will be obtained.

D. Magnetic Field Detector Operation

In operation during the performance of a search for magnetic anomalies, the magnetic field detector apparatus described herein operates as a gradient magnetometer to sense a small difference in the magnetic fields existing at two spaced-apart locations, which difference is the result of the presence of a magnetic anomaly or search object in the vicinity of one of the spaced-apart magnetic coils. The magnetic field detector, through the use of the two coils and measuring of the difference in the magnetic fields experienced by each, eliminates variations in the earth's magnetic field which occur over time. This cancellation of variations in the earth's magnetic field, of course, results from the fact that the variations are commonly experienced by the two coils; and in accordance with equation (4), the equal shift in frequencies $f_1$ and $f_2$ is algebraically subtracted out of the modulation term. In addition to these long-term magnetic field drifts, magnetic noise, such as that from nearby power lines, is also eliminated.

When the magnetic field detector circuitry is energized, as by the connection of a battery power source to the $+v$ leads to the circuitry, timer 86 is activated and begins supplying a squarewave output to switch relay 60 between alternate positions wherein the coils 54 and 68 are first energized by a current from the power supply and subsequently connected to the input of the high gain signal channel 108. Because the high gain signal channel has a bandpass amplifier section which is to be tuned to the frequency at which the protons are precessing within the liquid bodies contained in receptacles 52 and 70, and because the frequency of precession is dependent primarily upon the surrounding magnetic field of the earth, it is necessary to adjust the bandpass amplifier for the particular location where the search is being conducted. Since there are in effect two tuning circuits in the high gain signal channel, tuning of the signal channel to the proper detection frequency is accomplished by adjustment of the value of input capacitor 116 and adjustment of the value of capacitor 166 in the parallel resonant circuit of the bandpass filter 112. Changes in the center frequency of the bandpass amplifier can also be adjusted over a considerable frequency range without changing the capacitor by varying the core position of the inductor 164.

With the signal channel 108 properly tuned, and the coils 54 and 68 each experiencing a different magnetic field intensity, an output signal characterized by a beat modulation frequency will be available at the output terminal 168 of high gain signal channel 108. The carrier waveform of this signal has a frequency of between 1 and 3 kHz. The beat modulation frequency typically ranges between approximately 1/10 to 10 Hz. More generally expressed, the beat modulation frequency will be $\frac{1}{4}t$ Hz, where $t$ is the time from the beginning of the listening period (i.e., marked by the cessation of current flow in the probe coils) to the first detectable beat minimum. The time $t$ increases as the detectable carrier frequency difference decreases, which corresponds to a decrease in the detectable field strength difference. Therefore, in order to detect small or distant objects with the magnetic field detector, it is necessary to observe the output signal over a long period of time. Observation of the output signal is by observation and timing of the deflections of meter 208, which deflections show the interval between the first carrier frequency maximum and the next subsequent minimum.

The output signal from the high gain signal channel is, of course, applied to meter 208 through the rectification circuitry shown in FIG. 4. In order to properly time the deflections of the meter 208, it is necessary to adjust the rectification circuitry for proper operation. For example, if the meter signal is noisy, a larger capacitance value for capacitor 196 could be needed to provide additional filtering of the rectified proton carrier frequency. However, a balancing must be made between the extent of filtering and the resulting time constant, as a long time constant will affect the sharpness of the beat signal minimum. It is also necessary to adjust variable resistor 172 at the output of the high gain signal channel 108 to control the amplitude of the output signal therefrom. Accordingly, resistor 172 acts as a volume control. Finally and most importantly, the rectification level must be set by adjustment of variable resistor 180. With reference to the plots of FIG. 6, it is apparent that a desirable setting for the rectification level control is one that corresponds to the ($d$) level of FIG. 5. This level gives the sharpest minimum, as shown in the corresponding plot of FIG. 6d. Other settings, either higher or lower, result either in a minimum unnecessarily high on the meter readout or a flat minimum.

As should now be apparent, during a search for magnetic field changes, what is actually detected is the time interval from the beginning of the listen phase to the first beat minimum as shown on the meter. This time interval can be suitably measured through the use of a stopwatch actuated by the magnetic field detector operator upon his observation of the deflections of the meter movement. This manner of measuring the time interval integrates the human eye into the loop of detection. This technique of measuring the time interval is believed superior to the provision of an audio indicator in that a visual indicator can be more accurately read and make better use of a larger signal-to-noise ratio than does the aural mode for the sensing of a beat minimum.

The foregoing description of the invention has been directed to a particular preferred embodiment for purposes of explanation and illustration. It will be apparent, however, to those skilled in this art that several modifications and changes in the magnetic field detector apparatus may be made without departing from the scope and spirit of the invention. For example, the rectified output signal can be fed to a chart recorder, rather than to a meter, to provide a permanent record for later study and interpretation. In addition, if a chart recorder is used, the time base thereof can be readily correlated with various positions of the magnetic field detector apparatus when performing a search in the field. These, and other modifications of the invention, will be apparent to those skilled in this art. It is the applicant's intention in the following claims to cover all such equivalent modifications and variations as fall within the scope of the invention.

What is claimed is:

1. In a magnetic field detector having a pair of magnetically polarizable liquid bodies carried in spaced-apart relation, each having a magnetic probing coil wound therearound, with means connecting the coils in series and including timer means alternately applying current to the coils to polarize the liquid bodies to generate free precession signals therein and removing the polarizing current during a preset listening interval intervening polarizing intervals, the combination which comprises:
   (a) a high gain signal channel tuned to the frequency of said free precession signals generated in said coils for amplifying a signal that is the sum of said free precession signals,
   (b) means to rectify said sum signal at a selected bias level to produce an output signal which reduces to zero as said free precession signals decay, and
   (c) means having a mechanical movement operable to follow low frequency beat signals in the output signal from said rectifying means.

2. The combination of claim 1 wherein said high gain signal channel comprises:
   (a) a multi-stage preamplifier section having a high input impedance, and
   (b) a bandpass amplifier section coupled to the output of said preamplifier, said bandpass amplifier having a parallel resonance network in a feedback path between the input and output thereof.

3. The combination of claim 2 wherein said bandpass amplifier section comprises an operational amplifier, and said parallel resonance network comprises an inductor and a capacitor.

4. The combination of claim 1 wherein said rectifying means comprises:
   (a) a rectifier circuit having rectification level control means for shifting the threshold level at the input of the rectifier circuit, and
   (b) an amplifier circuit receiving the rectified signal for driving said mechanical movement.

5. The combination of claim 4 wherein said rectifier circuit is a peak detector and said rectification level control means is a biasing network at the input of said peak detector which comprises a variable impedance component operable to shift the detection level of the circuit.

6. The combination of claim 5 which further comprises a filtering network at the output of said peak detector.

7. A magnetic field detector, which comprises:
   (a) first and second magnetic field sensors, each having a body of polarizable liquid material with a coil wound therearound, said coils being spaced-apart and connected in series;
   (b) a single relay having first and second fixed contacts and a movable contact to be switched between said first and second contacts in response to the energization of a relay coil, said first fixed contact being connected to a source of current and said movable contact being connected to said magnetometer coils;
   (c) timer means for alternately energizing and de-energizing said relay coil to switch said movable relay contact back-and-forth between said fixed relay contacts;
   (d) a preamplifier circuit connected at its input to said second fixed relay contact for amplifying signals induced in said magnetometer coils due to the precessing of protons in the liquid bodies;
   (e) a bandpass amplifier coupled to the output of said preamplifier circuit, said bandpass amplifier having a parallel resonance circuit in a feedback path tuned to the frequency of the signals induced in said magnetometer coils;
   (f) a detector circuit in the form of a capacitor-filtered rectifier circuit for extracting a low frequency beat signal imposed as an envelope on the amplified sum of the signals induced in said coils, said detector circuit producing an output signal that is a reproduction of the low frequency beat signal; and
   (g) a meter having a meter movement operable to follow the low frequency beat signal at the output of said detector circuit and provide for observation and timing of the length of the interval between a maximum meter deflection and the next subsequent minimum meter deflection.

8. The magnetic field detector of claim 7 wherein said timer means is a squarewave generator having a current driver at the output connected in series with said relay coil.

9. The magnetic field detector of claim 7 wherein said liquid bodies each comprise distilled water.

10. The magnetic field detector of claim 7 wherein said bandpass amplifier comprises an operational amplifier having a parallel resonance circuit which comprises an inductor and a capacitor.

11. The magnetic field detector of claim 7 wherein said peak detector circuit comprises:
   (a) a rectifier circuit having rectification level control means for shifting the detection level of the circuit; and (b) a filter network having at least one shunt capacitor at the output of said rectifier circuit.

12. The magnetic field detector of claim 11 wherein said rectification level control means is a biasing network at the input of said rectifier circuit.

13. The magnetic field detector of claim 7 which further comprises a driver amplifier connected to the output of said peak detector for driving said meter movement.

14. A magnetic field detector instrument, which comprises:
  (a) a cylinder formed of nonmagnetic material and having at least one window intermediate the ends,
  (b) a receptacle of polarizable liquid carried in each end of said cylinder and surrounded by a coil for polarizing the protons in said liquid upon current flow in said coils,
  (c) a housing carried inside said cylinder proximate the window and enclosing a circuit board having electronic circuitry thereon which is operably connected to said coils,
  (d) electromagnetic shielding carried in said cylinder and enclosing interconnections between said electronic circuitry and said coils, and
  (e) a display meter carried on said cylinder and operably connected to the electronic circuitry.

15. The magnetic field detector of claim 14 wherein said cylinder is formed of PVC plastic tubing.

* * * * *